United States Patent
Thiyagarajan

(10) Patent No.: US 7,848,375 B1
(45) Date of Patent: Dec. 7, 2010

(54) RIDGE WAVEGUIDE LASER WITH FLARED FACET

(75) Inventor: Sumesh Mani K. Thiyagarajan, Fremont, CA (US)

(73) Assignee: Finisar Corporation, Sunnyvale, CA (US)

(*) Notice: Subject to any disclaimer, the term of this patent is extended or adjusted under 35 U.S.C. 154(b) by 34 days.

(21) Appl. No.: 12/130,341

(22) Filed: May 30, 2008

Related U.S. Application Data

(60) Provisional application No. 60/940,820, filed on May 30, 2007.

(51) Int. Cl.
*H01S 5/00* (2006.01)

(52) U.S. Cl. .................. 372/45.01; 372/50.1; 372/53; 372/54; 372/66

(58) Field of Classification Search ............... 372/50.1, 372/53, 54, 66; 438/164, 412
See application file for complete search history.

(56) References Cited

U.S. PATENT DOCUMENTS

| | | | | |
|---|---|---|---|---|
| 4,099,305 A | * | 7/1978 | Cho et al. ................. 438/40 |
| 4,236,122 A | * | 11/1980 | Cho et al. ................. 372/45.01 |
| 4,882,734 A | * | 11/1989 | Scifres et al. ............. 372/45.012 |
| 5,173,912 A | * | 12/1992 | Iwase et al. ............... 372/45.01 |
| 5,345,456 A | * | 9/1994 | Dai et al. .................. 372/22 |
| 6,375,364 B1 | * | 4/2002 | Wu ............................ 385/88 |
| 7,474,683 B2 | * | 1/2009 | Nakabayashi ............. 372/50.11 |
| 7,573,925 B1 | * | 8/2009 | Young et al. .............. 372/43.01 |
| 7,606,279 B1 | * | 10/2009 | Verma et al. .............. 372/45.01 |
| 2004/0008746 A1 | * | 1/2004 | Schmidt et al. ........... 372/46 |
| 2004/0105474 A1 | * | 6/2004 | Ohkubo et al. ........... 372/46 |
| 2005/0244095 A1 | * | 11/2005 | Ellison .................... 385/14 |
| 2006/0032665 A1 | * | 2/2006 | Ice ......................... 174/254 |
| 2006/0285560 A1 | * | 12/2006 | Nagashima et al. ...... 372/19 |
| 2007/0110116 A1 | * | 5/2007 | Vetrovec et al. .......... 372/66 |

FOREIGN PATENT DOCUMENTS

JP      2002-124733     *   4/2002

\* cited by examiner

*Primary Examiner*—Minsun Harvey
*Assistant Examiner*—Delma R Forde
(74) *Attorney, Agent, or Firm*—Workman Nydegger

(57) ABSTRACT

Embodiments disclosed herein relate to a laser die. The laser die includes a base epitaxial portion, a mesa portion, and first and second facets, wherein at least one of the first and second facets is flared such that an area of the facet is increased. Embodiments disclosed herein also relate to a high-speed laser. The high-speed laser includes a substrate, an active region positioned above the substrate, a mesa positioned above the active region, and one or more facets, wherein at least one of the one or more facets includes a flared portion configured to increase an area of the facet.

17 Claims, 5 Drawing Sheets

RIDGE WAVEGUIDE LASER WITH FLARED FACET

CROSS-REFERENCE TO RELATED APPLICATIONS

This application claims the benefit of Unites States Provisional Application No. 60/940,820, filed May 30, 2007, which is incorporated herein by reference in its entirety.

BACKGROUND

Semiconductor lasers are currently used in a variety of technologies and applications, including communications networks. One type of semiconductor laser is the distributed feedback ("DFB") laser. The DFB laser produces a stream of coherent, monochromatic light by stimulating photon emission from a solid state material. DFB lasers are commonly used in optical transmitters, which are responsible for modulating electrical signals into optical signals for transmission via an optical communication network.

Generally, a DFB laser includes a positively or negatively doped bottom layer or substrate, and a top layer that is oppositely doped with respect to the bottom layer. An active region, bounded by confinement regions, is included at the junction of the two layers. These structures together form the laser body. A grating is included in either the top or bottom layer to assist in producing a coherent light beam in the active region. The coherent stream of light that is produced in the active region can be emitted through either longitudinal end, or facet, of the laser body. DFB lasers are typically known as single mode devices as they produce light signals at one of several distinct wavelengths, such as 1,310 nm or 1,550 nm. Such light signals are appropriate for use in transmitting information over great distances via an optical communications network.

BRIEF SUMMARY

Embodiments disclosed herein relate to a laser die. The laser die includes a base epitaxial portion, a mesa portion, and first and second facets, wherein at least one of the first and second facets is flared such that an area of the facet is increased.

Embodiments disclosed herein also relate to a high-speed laser. The high-speed laser includes a substrate, an active region positioned above the substrate, a mesa positioned above the active region, and one or more facets, wherein at least one of the one or more facets includes a flared portion configured to increase an area of the facet.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teaching herein. The features and advantages of the teaching herein may be realized and obtained by means of the instruments and combinations particularly pointed out in the appended claims. These and other features will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only illustrated embodiments of the invention and are therefore not to be considered limiting of its scope. The invention will be described and explained with additional specificity and detail through the use of the accompanying drawings in which.

DETAILED DESCRIPTION

Embodiments disclosed herein relate to a laser die. The laser die includes a base epitaxial portion, a mesa portion, and first and second facets, wherein at least one of the first and second facets is flared such that an area of the facet is increased.

Embodiments disclosed herein also relate to a high-speed laser. The high-speed laser includes a substrate, an active region positioned above the substrate, a mesa positioned above the active region, and one or more facets, wherein at least one of the one or more facets includes a flared portion configured to increase an area of the facet.

Reference will now be made to figures wherein like structures will be provided with like reference designations. It is understood that the drawings are diagrammatic and schematic representations of presently preferred embodiments of the invention, and are not limiting of the present invention nor are they necessarily drawn to scale.

Example Operating Environment

Figure 1:
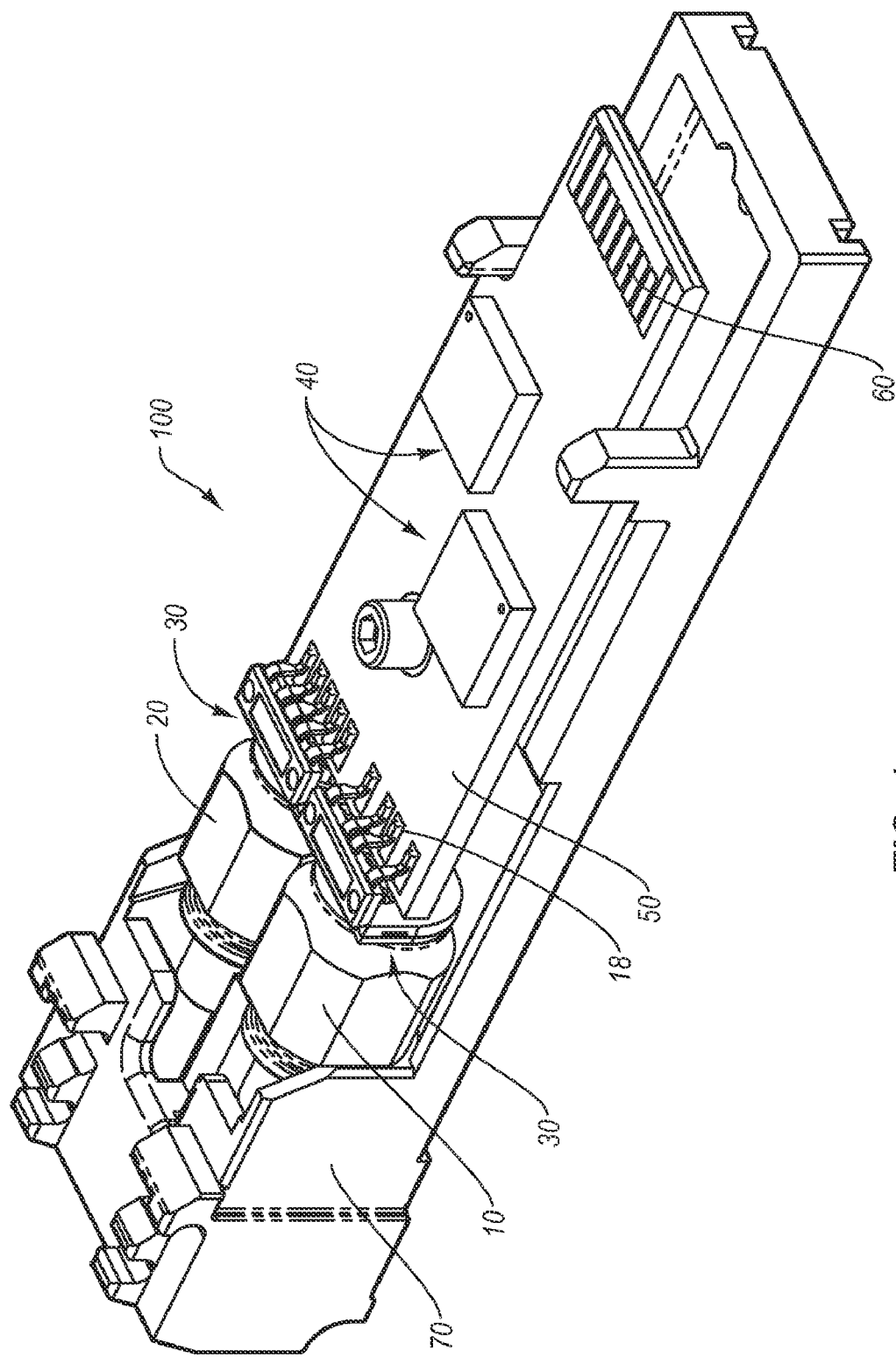
FIG. 1 is a perspective view of an optical transceiver module that serves as one exemplary environment in which embodiments of the present invention can be practiced.

Reference is first made to FIG. 1, which depicts a perspective view of an optical transceiver module ("transceiver"), generally designated at 100, for use in transmitting and receiving optical signals in connection with an external host that is operatively connected in one embodiment to a communications network (not shown). As depicted, the transceiver shown in FIG. 1 includes various components, including a receiver optical subassembly ("ROSA") 10, a transmitter optical subassembly ("TOSA") 20, electrical interfaces 30, various electronic components 40, and a printed circuit board ("PCB") 50. In detail, two electrical interfaces 30 are included in the transceiver 100, one each used to electrically connect the ROSA 10 and the TOSA 20 to a plurality of conductive pads 18 located on the PCB 50. The electronic components 40 are also operably attached to the PCB 50. An edge connector 60 is located on an end of the PCB 50 to enable the transceiver 100 to electrically interface with a host (not shown here). As such, the PCB 50 facilitates electrical communication between the ROSA 10/TOSA 20, and the host. In addition, the above-mentioned components of the transceiver 100 are partially housed within a shell 70. Though not shown, the shell 70 can cooperate with a housing portion to define a covering for the components of the transceiver 100.

While discussed in some detail here, the optical transceiver 100 is described by way of illustration only, and not by way of restricting the scope of the invention. As mentioned above, the optical transceiver 100 in one embodiment is suitable for optical signal transmission and reception at a variety of per-second data rates, including but not limited to 1 Gbit, 2 Gbit, 2.5 Gbit, 4 Gbit, 8 Gbit, 10 Gbit, or higher rates. Furthermore, the principles of the present invention can be implemented in optical transmitters and transceivers of shortwave and long wave optical transmission and any form factor such as XFP, SFP and SFF, without restriction.

The TOSA 20 of the transceiver 100 is one example of an optical transmitter that can employ an optical source, such as a semiconductor laser, that is configured according to embodiments of the present invention. Briefly, in operation the transceiver 100 receives electrical signals from a host (not shown) or other data signal-producing device to which the transceiver is operably connected for transmission onto an optical fiber operably connected to the TOSA 20. Circuitry of the transceiver 100 drives a laser (described below) within the TOSA 20 with signals that cause the TOSA to emit onto the optical fiber optical signals representative of the information in the electrical signal provided by the host. Accordingly, the TOSA 20 serves as an electro-optic transducer. Having described a specific environment with respect to FIG. 1, it will be understood that this specific environment is only one of countless architectures in which the principles of the present invention may be employed. As previously stated, the principles of the present invention are not intended to be limited to any particular environment.

Example Distributed Feedback Laser

A distributed feedback ("DFB") laser is one example of a semiconductor optical device employed according to embodiments of the present invention. By way of general overview, a DFB laser contains a cavity having an active medium and a distributed reflector that operates in a wavelength range of the laser action. The DFB laser has multiple modes, including both longitudinal and transversal modes, but one of these modes will typically offer better loss characteristics relative to the other modes. This single mode typically defines a single-frequency operation of the DFB laser.

The following description provides various details regarding a ten gigabit/second ("10 G") DFB laser configured for light emission at a wavelength of approximately 1310 nm. The following description includes both structural and functional characteristics of the 10 G DFB laser, together with certain details regarding the manufacturing processes used to build the laser. Note, however, that this description is meant to be exemplary only; indeed, lasers and other semiconductor optical devices having structural and/or functional aspects that differ from the present description can also benefit from the principles of embodiments of the present invention as disclosed herein. It is also appreciated that additional or alternative layers, layer thicknesses, or structures can be incorporated into the present laser device as will be understood by those of skill in the art. The following discussion is therefore not intended to limit the present invention in any way. In particular, the principles of the present invention may also be achieved in a 1310 nm 2.5 G DFB laser.

a. Base Epitaxial Layers

Figure 2:
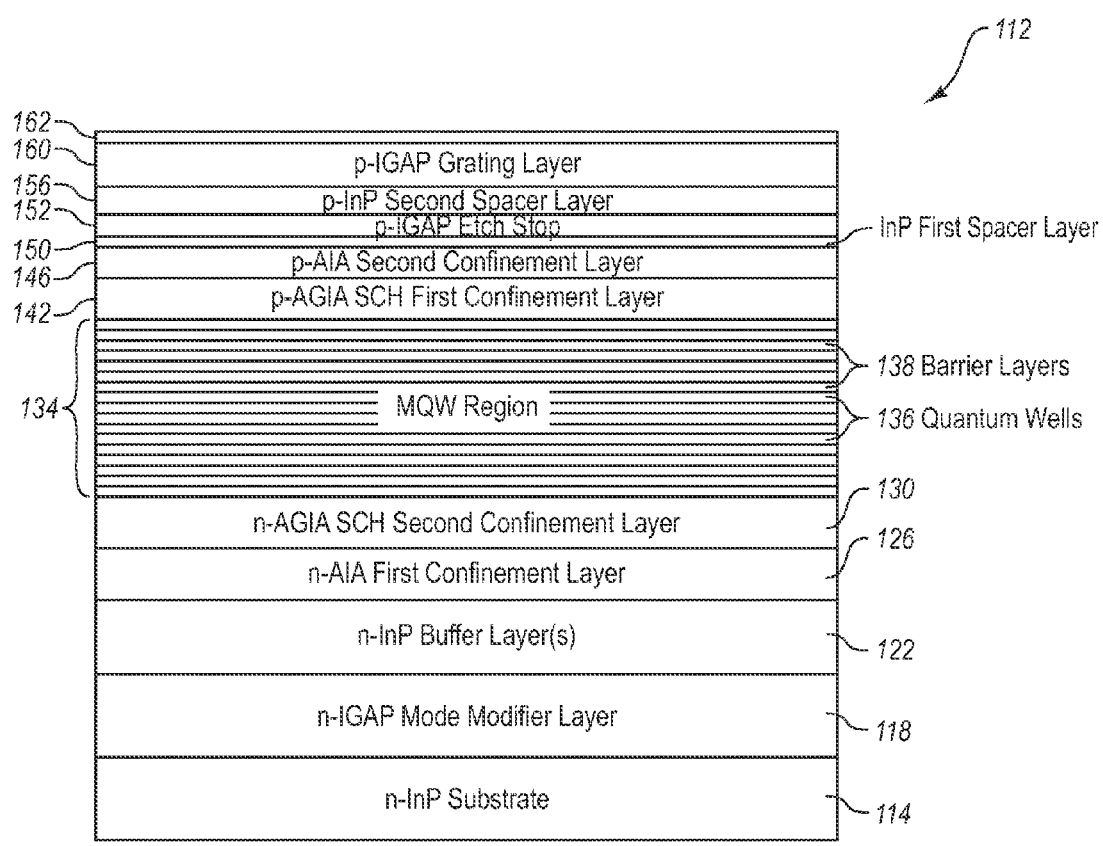
FIG. 2 is a cross sectional side view of an epitaxial base portion of a distributed feedback ("DFB") laser, according to one embodiment of the present invention.

FIG. 2 illustrates the base epitaxial layers 112 of an example 10 G DFB laser, (such as DFB 110 of FIG. 3), at a stage prior to etching of the grating layers. The base epitaxial layers 112 are grown on an Indium Phosphide substrate (n-InP substrate) 114.

A "mode modifier" layer (n-IGAP Mode Modifier) 118 is grown on top of the substrate 114 using Indium Gallium Arsenide Phosphide at an approximate thickness of 120 nm. This layer functions to reduce the power of second-order transversal modes that propagate within the laser structure. In particular, the mode modifier layer 118 effectively increases the loss associated with these second-order transverse modes and couples the modes away from the gain medium of the laser. This suppression of second-order transverse modes allows for wider mesa widths on the laser because the laser is less sensitive to these modes.

A buffer layer (n-InP) 122 is made of Indium Phosphide and grown on top of the "mode modifier" layer 118. This buffer layer is approximately 1.4 μm thick and provides a surface on which the n-layers of the laser are grown.

A first n-confinement layer 126 of Aluminum Indium Arsenide (n-AIA) is grown at a thickness of approximately 20 nm on the buffer layer and is doped with silicon. A second n-confinement layer 130 of Aluminum Gallium Indium Arsenide (n-AGIA SCH) is grown at a thickness of 30 nm on the n-AIA layer and is also doped with silicon. Both of these layers are current confinement layers and effectively maintain electrons within the laser active region so that photons are produced. The n-AGIA SCH second n-confinement layer 130 is graded to improve the confinement characteristics of the layer. The thicknesses of these n-layers were designed to be thin in order to optimize the thermal performance of the laser.

A multi-quantum well active region (MQW region) 134 is grown on the n-type confinement layers. In this example, the active region 134 is designed to have eight wells 136 with corresponding wavelengths of ~1295 nm. Quantum barriers 138 between the wells have corresponding wavelengths of approximately 980 nm. Standard barrier wavelengths are in the range of 1060-1090 nm and thus have smaller barrier heights than typical multi-quantum-well designs. The depth and width of the wells are designed to produce a 1310 nm photon. The active region is designed to be "strain compensated" which means that the barriers are designed to have opposing strain characteristics relative to the well strain characteristics. As a result, the strain generated from the barriers at least partially cancels the strain generated by the wells and reduces the overall strain on the layer. In the illustrated embodiment, quantum well design may be manufactured so that a complete cancellation of strain does not occur, but a small amount of strain remains for performance reasons.

In addition, the layers of the MQW region 134 are intentionally doped with Zn, to maintain a low-level p-type doping. This is done to assure that the p-n junction of the laser diode always occurs in the same place, and is not made variable by unpredictable dopant diffusion processes. Further details regarding the doping of the MQW region 134 will be given further below.

A first p-confinement layer 142 of Aluminum Gallium Indium Arsenide (p-AGIA SCH) is grown on the active region at a predetermined thickness and is doped with zinc. A second p-confinement layer 146 of Aluminum Indium Arsenide (p-AIA) is grown at a predetermined thickness, on the p-AGIA SCH layer and is also doped with zinc. Both of the p-layers are confinement layers and effectively maintain holes within the active region so that photons are produced.

The p-AGIA SCH layer 142 is graded to improve the confinement characteristics of the layer.

A spacer layer 150 is located above the p-confinement layers. This spacer layer is made of Indium Phosphide. Various "above-active" grating layers are located above the spacer layer. An etch stop layer (p-IGAP etch stop) 152 made of Indium Gallium Arsenide Phosphide is grown on the spacer layer 150. This etch stop layer is provided for stopping the mesa etch during the regrowth process.

A second spacer layer 156 is provided to separate the etch stop layer 152 and the grating layer. In the illustrated design, the grating etch step is timed to stop within this spacer layer. The layer is made of Indium Phosphide (p-InP).

A grating layer (p-IGAP) 160 is grown on the second spacer layer 156 and is made of Indium Gallium Arsenide Phosphide. The grating layer is "above active" (as compared to other possible designs in which the grating is below the active region). Laser holography, wet etching, and subsequent InP regrowth, as explained further below, are used to create a uniform grating, consisting of alternating layers of high index IGAP and low index InP down the length of the laser cavity.

The laser cavity of the example DFB laser can support two degenerate longitudinal grating modes because the grating formed in the grating layer 160 is uniform (as opposed to, e.g., a quarter-wave shifted design). Selection of one or the other of these two modes is dependent upon the phase associated with the facet cleave, which is dependent upon the location of the cleave with respect to the grating period. Because the location of the cleave cannot be controlled with sufficient precision, all phase possibilities will be represented by any ensemble of devices of this design. As a result, there will always be a finite percentage of laser parts for which both grating modes are equally supported, resulting in inadequate single-mode behavior. These lasers are discarded and not sold.

A top layer 162 is provided above the grating layer on which regrowth of other layers is performed.

b. Grating Fabrication and Regrowth

Figure 3:
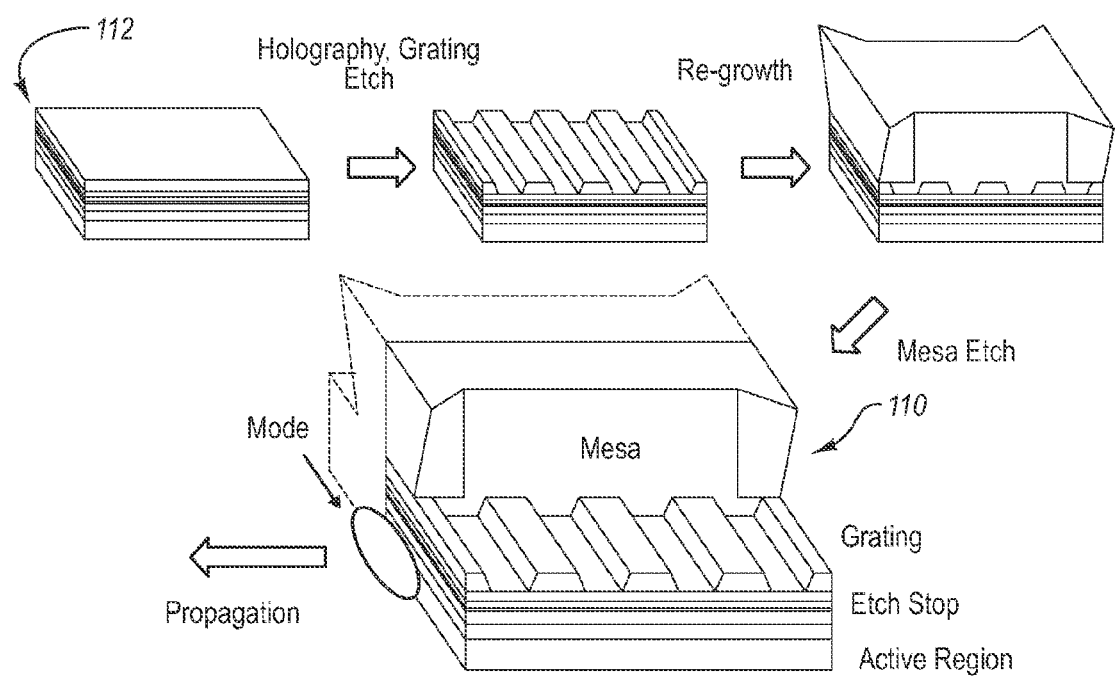
FIG. 3 is a progressive view of various processing and manufacture stages performed on the epitaxial base portion shown in FIG. 2.

FIG. 3 illustrates various grating fabrication and subsequent regrowth stages employed in forming portions of the structure of the DFB laser 110. In particular, FIG. 3 shows a side view of the base epitaxial structure 112 of FIG. 2, together with subsequent grating fabrication and regrowth steps in forming the DFB laser 110. As described above and by way of brief overview, a wet etch is performed to etch periodic gaps within the grating layer, as shown in FIG. 3. After the etch is completed and the grating teeth are created, thick Indium Phosphide is grown ("regrowth") on the etched, base epitaxial structure, in order to fill the gaps with low-index InP and also to form the mesa layer, also shown in FIG. 3. The regrowth is completed with an Indium Gallium Arsenide layer for electrical contact.

As mentioned above, the Indium Phosphide regrowth is used to create a mesa on the epitaxial base that provides current confinement and also functions as a waveguide, by virtue of lateral optical confinement. This structure is also referred to herein as a "ridge waveguide" or RWG structure. Photoresist is used to etch ridges on the regrowth, thereby defining the mesa of the DFB laser. Both dry and wet etching can be used in creating the mesa ridges.

After the etching process is complete, a dielectric layer (shown in FIG. 4B) is placed on the structure. In the present design, a "triple stack" of Silicon Nitride, Silicon Dioxide, and Silicon Nitride is used as the dielectric. This layer is typically thick in order to reduce parasitic capacitance (and improve speed) and is used to confine the current within the mesa. In other embodiments, a single layer of Silicon Nitride or Silicon Oxide can be employed for the dielectric layer.

The dielectric layer is removed from the top of the mesa to allow an electrical contact and metallic layer (shown in FIG. 4B) to be placed on the mesa. Electrical contact is made by depositing metal onto the Indium Gallium Arsenide layer at the top of the mesa. This contact is both a non-alloy contact and a low penetration contact.

A metallic layer (shown in FIG. 4B) is placed on the electrical contact to which electrical current may be provided to the laser structure. In the present embodiment, the metallic layer is made of three sub-layers of titanium, platinum and gold. The titanium sun-layer is placed directly on the electrical contact layer, then the platinum sub-layer and gold sub-layer are applied. This metallic layer provides sufficient conductivity to the Indium Gallium Arsenide layer so that current can be properly provided to the laser structure.

Bottom electrical contacts are generated by thinning the InP substrate and placing an n-type metallic layer (not shown) on the bottom.

A DFB laser is removed from a wafer using common techniques by cleaving and breaking the wafer both horizontally and laterally to separate each laser. After this process, anti-reflective ("AR") and high-reflective ("HR") coating processes are performed to encapsulate the active region of the laser and provide the requisite reflectivity characteristics of the laser cavity. The reflectivity characteristics define the optical power emitted from the back of the laser and the front of the laser. In uniform grating designs, a majority of the optical power is emitted from the front of the laser which optically couples with an optical fiber. A minority of the optical power is emitted from the back of the laser, which may couple with a photodetector (not shown) that is used to monitor laser performance.

In one embodiment, the AR and HR coatings are made of layers of Silicon Oxide and Silicon. The reflectivity of the AR coating is designed to be less than about 0.5%, while the HR coating is designed to be higher than approximately 90%. Once the coating process is complete, a testing process is performed in which the power characteristics and optical spectrum are tested.

The DFB laser 110 and photodetector are packaged into an optical sub-assembly, such as the TOSA 20 shown in FIG. 1, which is subsequently packaged into an optical module, e.g., the transceiver 100 of FIG. 1, along with driver and control integrated circuits.

c. Aspects of a Flared Facet of a Ridge Waveguide Laser

As mentioned previously, a ridge waveguide laser or RWG laser such as laser 110 previously described typically emits a beam of light through either longitudinal end, or facet, of the laser body. The two facets of the RWG laser are typically coated with a coating material that optimizes the emission of light from the active region. Generally, the diameter of the beam of light emitted from a RWG laser is determined by the width of the mesa of the RWG laser and the details of the base epitaxial design such as the base epitaxial portion shown in FIG. 2.

Generally, a RWG laser can only safely operate well below a critical optical intensity level called Catastrophic Optical Damage (COD) threshold intensity. When a RWG laser is operated at or above this intensity level, the laser dies catastrophically. Typically, the COD threshold intensity level is determined by the material composition of the RWG laser, by the material composition of the facet coating material, if any, which is applied to the facets of the RWG laser, and the effective cross-sectional area of the output beam of the RWG laser.

Once these factors have been determined, a RWG laser is typically subject to catastrophic optical damage by any attempt to increase the output optical intensity. Accordingly, in order to increase maximum optical power emitted by a laser without exceeding the COD threshold intensity for a given RWG laser of specific material and facet coating material, it is desirable to increase the facet area or the area of the ridge. Advantageously, the principles of the present invention provide for the flaring of one or more facets of an RWG laser in order to increase the facet area and thus increase the optical strength of a beam of light emitted from the RWG laser.

Figure 4A:
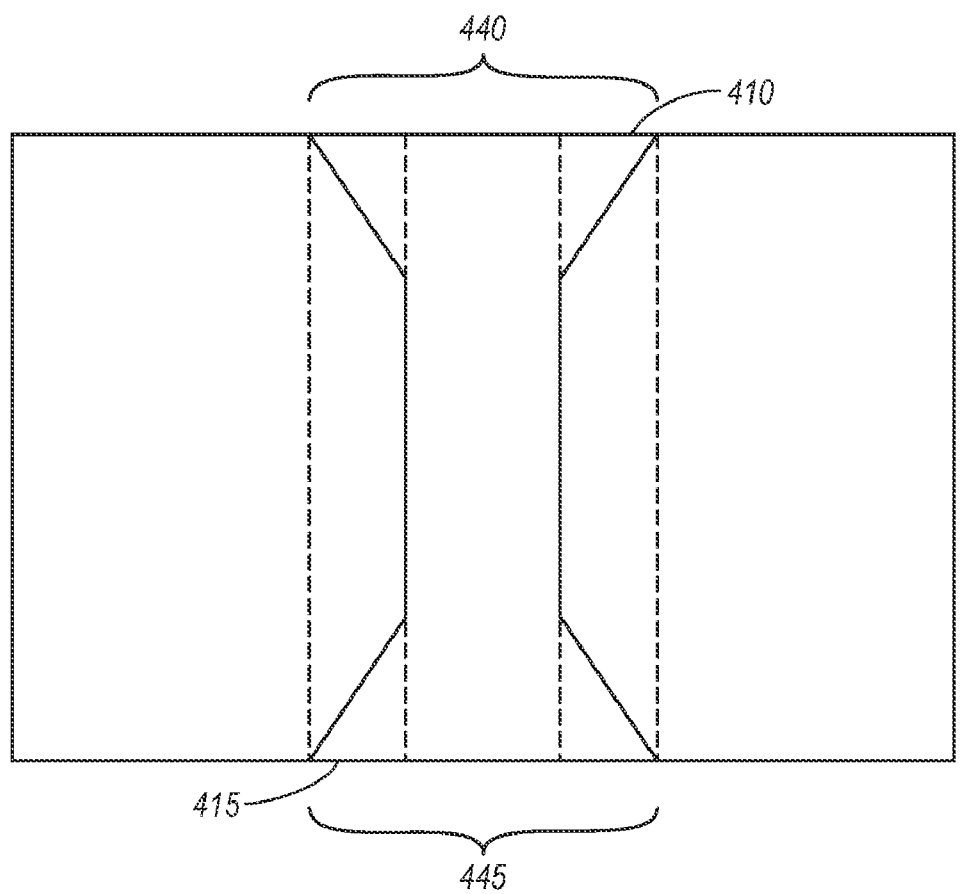
FIGS. 4A-4C illustrate views of an embodiment of a laser die with flared facets.
Figure 4B:
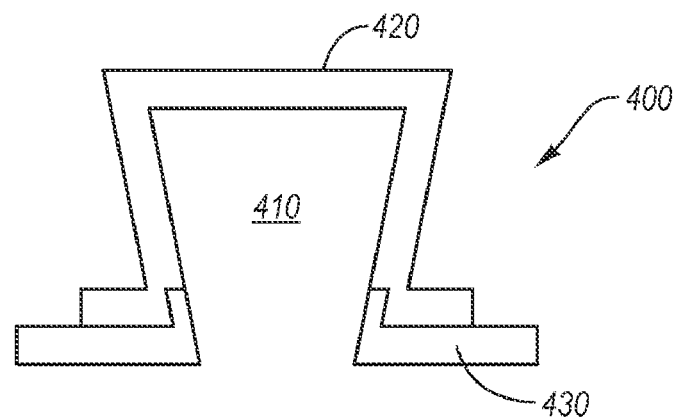
Figure 4C:
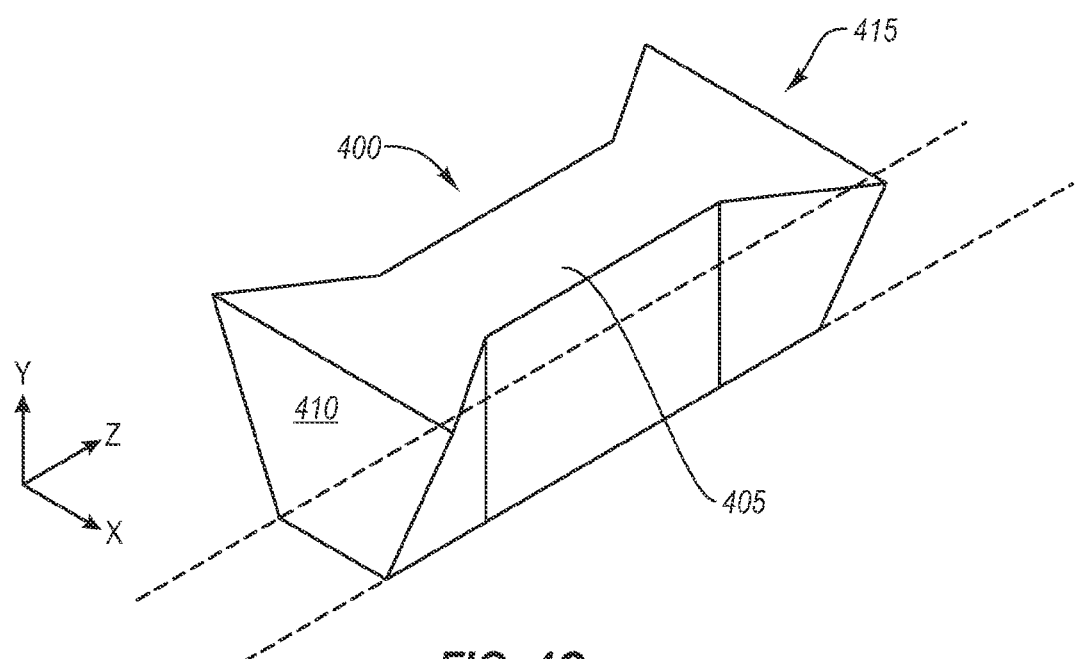

Turning now to FIGS. 4A-4C, various views of one embodiment of a RWG laser 400 such as, but not limited to DFB laser 110, is illustrated. As shown, FIG. 4A illustrates a top view of the RWG laser 400, FIG. 4B illustrates a front view of RWG laser 400, and FIG. 4C illustrates a side perspective view of the RWG laser 400.

As shown in FIG. 4B, RWG laser 400 may have a thin layer of metal 420 and a dielectric layer 430 placed over top of it. In operation, layers 420 and 430 are configured to allow for a current to be applied to RWG laser 400 to cause the laser to emit a beam of light.

FIG. 4A illustrates a first facet 410 and a second facet 415. As mentioned, facets 410 and 415 may be coated with a coating material that optimizes the emission of light from the active region. As further shown in FIG. 4A, first facet 410 and second facet 415 may be flared to thereby locally increase the area of the ridge or mesa at the facet edges. For example, first facet 410 may be flared by a flare width 440. In like manner, second facet 415 may be flared by a flare width of 445. In other words, the first facet 410 may have an increased width 440 at its edge relative to the body of the mesa or ridge. Likewise, second facet 415 may have an increased width 445 at its edge relative to the body of the mesa or ridge.

Thus, in the description and in the claims a flared facet is defined to mean a facet that has an increased local area relative to the body of the mesa or ridge. This is particularly seen in FIG. 4C, where facets 410 and 415 both have an increased area relative to the body of the mesa 405. Advantageously, flaring first facet a width 440 and flaring second facet a width 445 increases the facet area and at least partially allows for increased optical emissions.

Figure 5:
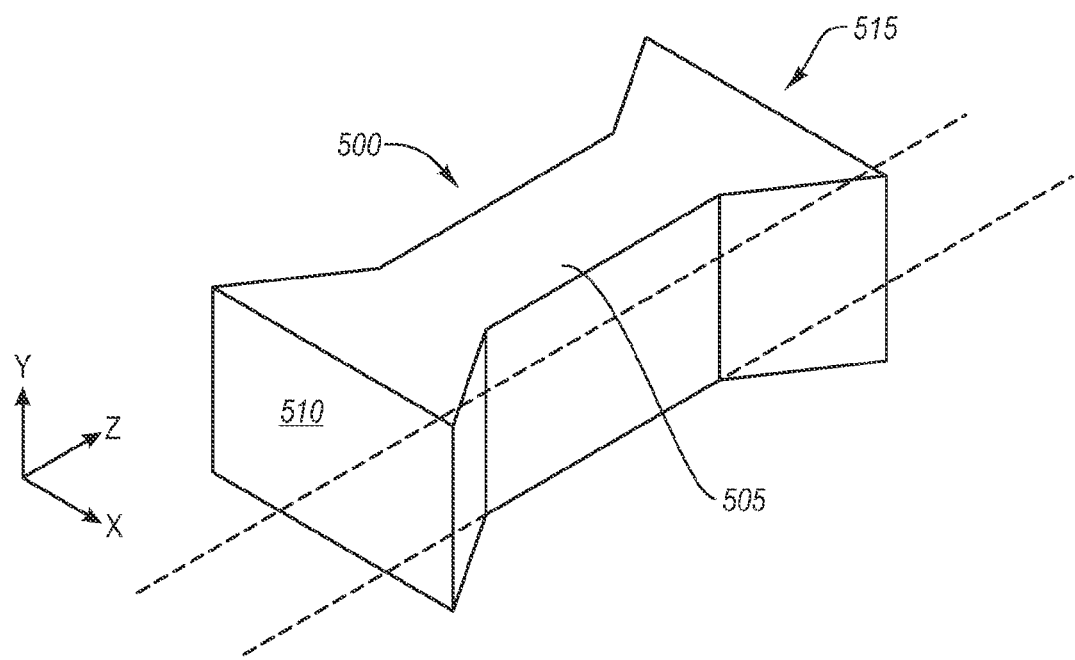
FIG. 5 illustrates a view of an alternative embodiment of a laser die with flared facets.

FIG. 5 illustrates a perspective view of an alternative embodiment of a RWG laser 500. As illustrated, RWG laser 500 includes a first facet 510 and a second facet 515. As shown, facets 510 and 515 are flared such that they have an increased area relative to the body of the mesa 505.

In some embodiments, flare width 440 and/or 445 may be approximately 10 microns in an X dimension or approximately 10 microns in a Y dimension. Alternatively, the maximum flare widths may be approximately 10 microns in both the X and Y dimensions. Of course, it will be appreciated, that first and second facets 410 and 415 (and facets 510 and 515) may be flared different amounts as circumstances warrant.

It should be noted that the exact amount that the first and second facets 410 and 415 (and facets 510 and 515) are flared will typically be based on desired performance criteria. For example, the amount that facet 410 and 415 are flared will often impact other operational parameters of RWG laser 400 such as, but not limited to, threshold currents, L-I curves, and modulation efficiency. Accordingly, the amount that facets 410 and 415 are flared typically should be chosen so as to optimize the area of facets 410 and 415 without adversely impacting other important operational parameters. Of course, it will be appreciated that in some instances the desirability of increasing the area of facets 410 and 415 in order to increase optical beam strength will outweigh the need for other operational considerations.

In some embodiments, it may only be necessary to flare one of the facets 410 and 415 (or facets 510 and 515). For example, the optical intensity of the emitted beam of light is often stronger near one facet than the other facet. In such circumstances, it may help the performance of RWG laser 400 to only flare facet 410 or facet 415 without the need to flare the other facet. Only flaring one facet may also have advantageous impact on the other operational parameters.

In some embodiments, facets 410 and 415 will be flared the desired amount during the manufacture of RWG laser 400. Likewise, facets 510 and 515 will be flared the desired amount during the manufacture of RWG laser 500. The desired widths of the flares may be determined by modeling or other known methods and then incorporated into the various laser manufacturing techniques known in the art.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A laser die, comprising:
   a substrate;
   a base epitaxial portion grown on the substrate, wherein the base epitaxial portion includes:
      an active region positioned above the substrate;
      a first confinement layer positioned above the active region;
      a second confinement layer positioned above the first confinement layer; and
      a first spacer layer positioned above the second confinement layer;
      a first spacer layer positioned above the second confinement layer;
   a mesa portion;
   first and second facets, wherein at least one of the first and second facets is flared such that an area of the facet is increased;
   a mode modifier layer positioned above the substrate;
   a buffer layer positioned above the mode modifier layer;
   a third confinement layer positioned above the buffer layer;
   a fourth confinement layer positioned above the third confinement layer and below the active region;
   an etch stop layer positioned above the first spacer layer;
   a second spacer layer positioned above the etch stop layer;
   a grating layer positioned above the second spacer layer; and
   a top layer positioned above the grating layer and below the mesa.

2. The laser die in accordance with claim 1, wherein both the first and second facets are flared such that an area of both facets is increased.

3. The laser die in accordance with claim 1, wherein the at least one facet is flared approximately 10 microns in an X dimension.

4. The laser die in accordance with claim 1, wherein the at least one facet is flared approximately 10 microns in a Y dimension.

5. The laser die in accordance with claim 1, wherein the at least one facet is flared approximately 10 microns in both an X and a Y dimension.

6. The laser die in accordance with claim 1, wherein flaring the at least one facet at least partially increases the optical strength of an emitted beam of light.

7. The laser die in accordance with claim 1, wherein the at least one flared facet includes a coating material that at least partially increases the emission of light from the laser die.

8. The laser die in accordance with claim 1, wherein a thin metal layer and/or a dielectric layer are placed over top at least a portion of the mesa portion.

9. A high-speed laser comprising:
   a substrate;
   an active region positioned above the substrate;
   a first confinement layer positioned above the active region;
   a second confinement layer positioned above the first confinement layer;
   a first spacer layer positioned above the second confinement layer;
   a mesa positioned above the active region;
   one or more facets, wherein at least one of the one or more facets includes a flared portion configured to increase an area of the facet;
   a mode modifier layer positioned above the substrate;
   a buffer layer positioned above the mode modifier layer;
   a third confinement layer positioned above the buffer layer;
   a fourth confinement layer positioned above the third confinement layer and below the active region;
   an etch stop layer positioned above the first spacer layer;
   a second spacer layer positioned above the etch stop layer;
   a grating layer positioned above the second spacer layer; and
   a top layer positioned above the grating layer and below the mesa.

10. The laser as recited in claim 9, wherein the laser is an FP laser.

11. The laser as recited in claim 9, wherein the laser is a DFB laser.

12. The laser as recited in claim 9, further wherein:
   the substrate, the mode modifier layer, the first confinement layer, and the second confinement layer are n-type layers;
   the third confinement layer, the fourth confinement layer, the first spacer layer, the etch stop layer, the second spacer layer, and the grating layer are p-type layers; and
   a doping material of the active region is a p-type material.

13. The laser as recited in claim 12, further wherein:
   the substrate, the mode modifier layer, the first confinement layer, and the second confinement layer are p-type layers; and
   the third confinement layer, the fourth confinement layer, the first spacer layer, the etch stop layer, the second spacer layer, and the grating layer are n-type layers; and
   a doping material of the active region is an n-type material.

14. The laser as recited in claim 9, wherein more than one facet is flared such that an area of the facets is increased.

15. The laser as recited in claim 9, wherein flaring the at least one facet at least partially increases the optical strength of an emitted beam of light.

16. A TOSA comprising:
   a housing; and
   the laser as recited in claim 9 positioned within the housing.

17. An optical transceiver module comprising:
   the TOSA as recited in claim 16;
   a ROSA; and
   a PCB in electrical communication with the TOSA and the ROSA.

* * * * *